(12) United States Patent
Chaplin et al.

(10) Patent No.: US 8,255,867 B1
(45) Date of Patent: Aug. 28, 2012

(54) METHODS AND SYSTEMS FOR USE IN SPLITTING WIRING DIAGRAMS

(75) Inventors: Carey S. Chaplin, Seattle, WA (US); Monica C. Rosman LaFever, Renton, WA (US)

(73) Assignee: The Boeing Company, Chicago, IL (US)

( * ) Notice: Subject to any disclaimer, the term of this patent is extended or adjusted under 35 U.S.C. 154(b) by 102 days.

(21) Appl. No.: 12/845,836

(22) Filed: Jul. 29, 2010

(51) Int. Cl.
*G06F 15/04* (2006.01)
*G06F 17/50* (2006.01)

(52) U.S. Cl. ........................... 716/139; 716/126

(58) Field of Classification Search ............... 716/126, 716/139
See application file for complete search history.

(56) References Cited

U.S. PATENT DOCUMENTS

| | | | |
|---|---|---|---|
| 6,412,102 B1 * | 6/2002 | Andreev et al. | 716/129 |
| 6,606,731 B1 | 8/2003 | Baum et al. | |
| 6,766,331 B2 | 7/2004 | Shema et al. | |
| 7,013,028 B2 * | 3/2006 | Gont et al. | 382/113 |
| 7,212,936 B2 | 5/2007 | Baum et al | |
| 7,246,328 B2 | 7/2007 | Boose et al. | |
| 7,478,352 B2 | 1/2009 | Chaplin et al. | |
| 7,529,648 B2 | 5/2009 | Baum et al. | |
| 2005/0114096 A1 * | 5/2005 | Baum et al. | 703/1 |
| 2005/0210434 A1 * | 9/2005 | Rouch et al. | 716/12 |
| 2007/0300198 A1 * | 12/2007 | Chaplin et al. | 716/10 |
| 2009/0282379 A1 * | 11/2009 | Singh et al. | 716/8 |

* cited by examiner

*Primary Examiner* — Suresh Memula
(74) *Attorney, Agent, or Firm* — Armstrong Teasdale LLP (57) ABSTRACT

Methods and systems are provided for generating a wiring diagram based on a wiring configuration stored in a memory device. The wiring configuration is deconstructed, a new wiring configuration is constructed on a grid that includes a plurality of fields. The new wiring configuration is based on the wiring configuration. The wiring diagram is generated based on the plurality of fields.

17 Claims, 10 Drawing Sheets

METHODS AND SYSTEMS FOR USE IN SPLITTING WIRING DIAGRAMS

BACKGROUND

The present disclosure relates to wiring diagrams and more particularly to methods and systems for use in splitting dynamically-created wiring configurations for presentation on at least one drawing sheet.

At least some known wiring diagrams are representative of wiring configurations that may include hundreds of wires. As such, at least some known wiring diagrams can be extremely complicated, thereby making it difficult for a user to identify and focus on a desired wire or group of wires. Moreover, to print some known wiring diagrams on a single sheet, the wiring diagram may be compressed to a size that renders the wiring diagram illegible and/or otherwise useless.

At least some known wiring diagrams are created by an illustrator that may manually split a wiring configuration into a plurality of sheets. Each sheet includes a logically connected subset of wires and references to other sheets. By splitting the diagram into multiple sheets, the user may more easily and readily identify a particular wire or group of wires. However, because of the complexity of some wiring diagrams, manually splitting such wiring configurations may be time-consuming and/or labor-intensive. Moreover, often such wiring diagrams must be manually split each time the wiring configuration is updated or otherwise changed.

BRIEF DESCRIPTION

In one aspect, a method is provided for automatically generating a wiring diagram based on a wiring configuration stored in a memory device. The method includes deconstructing the wiring configuration and constructing a new wiring configuration on a grid that includes a plurality of fields. The new wiring configuration is based on the wiring configuration. The wiring diagram is generated based on the plurality of fields.

In another aspect, a computing device is provided for generating a wiring diagram based on a wiring configuration. The computing device includes a processor and a memory device coupled to the processor. The wiring configuration is stored in the memory device. The computing device is programmed to deconstruct the wiring configuration and construct a new wiring configuration on a grid that includes a plurality of fields. The new wiring configuration is based on the wiring configuration. The wiring diagram is generated based on the plurality of fields.

In yet another aspect, a computer-based system is provided for generating a wiring diagram based on a wiring configuration stored in a memory device. The computer-based system includes a construction module and a presentation module. The construction module is programmed to deconstruct the wiring configuration and construct a new wiring configuration on a grid that includes a plurality of fields. The new wiring configuration is based on the wiring configuration. The presentation module is programmed to generate the wiring diagram based on the plurality of fields.

The features, functions, and advantages that have been discussed can be achieved independently in various embodiments of the present invention or may be combined in yet other embodiments further details of which can be seen with reference to the following description and drawings.

DETAILED DESCRIPTION

The subject matter described herein relates generally to wiring diagrams. More particularly, the subject matter described herein relates to methods and systems for use in splitting dynamically-created wiring configurations for presentation on at least one drawing sheet. As used herein, "wiring configuration" includes a schematic landscape and/or design of a plurality of wires. As such, a wiring configuration is a representation of a wired component and/or system. Moreover, as used herein, "wiring diagram" includes a representation of a wiring configuration.

In one embodiment, a wiring configuration is deconstructed and a new wiring configuration is constructed on a grid that includes a plurality of fields. The new wiring configuration is based on the wiring configuration. A wiring diagram is generated based on the plurality of fields. As such, dynamic wiring diagrams based on at least one wiring configuration may be presented based on user-determined criteria. Although the present disclosure is described in the context of wiring diagrams and, more specifically, wiring configurations of aircraft structures, it should be understood that the present disclosure may be used in other contexts in which it is desirable to manipulate dynamically-created wiring configurations.

In one embodiment, technical effects of the methods, systems, and computer-readable media described herein include at least one of: (a) deconstructing a wiring configuration; (b) separating a representation of a plurality of wires based on a connectivity of the plurality of wires; (c) removing a representation of a shield wire and/or a ground wire from the plurality of wires; (d) constructing a new wiring configuration on a grid that includes a plurality of fields; (e) grouping a representation of a plurality of wires based on a connectivity of the plurality of wires; (f) adding a representation of a shield wire and/or a ground wire from the plurality of wires; and (g) arranging at least a portion of the new wiring configuration based on a predetermined threshold.

As used herein, an element or step recited in the singular and proceeded with the word "a" or "an" should be understood as not excluding plural elements or steps unless such exclusion is explicitly recited. Furthermore, references to "one embodiment" of the present invention or the "exemplary embodiment" are not intended to be interpreted as excluding the existence of additional embodiments that also incorporate the recited features.

Figure 1:
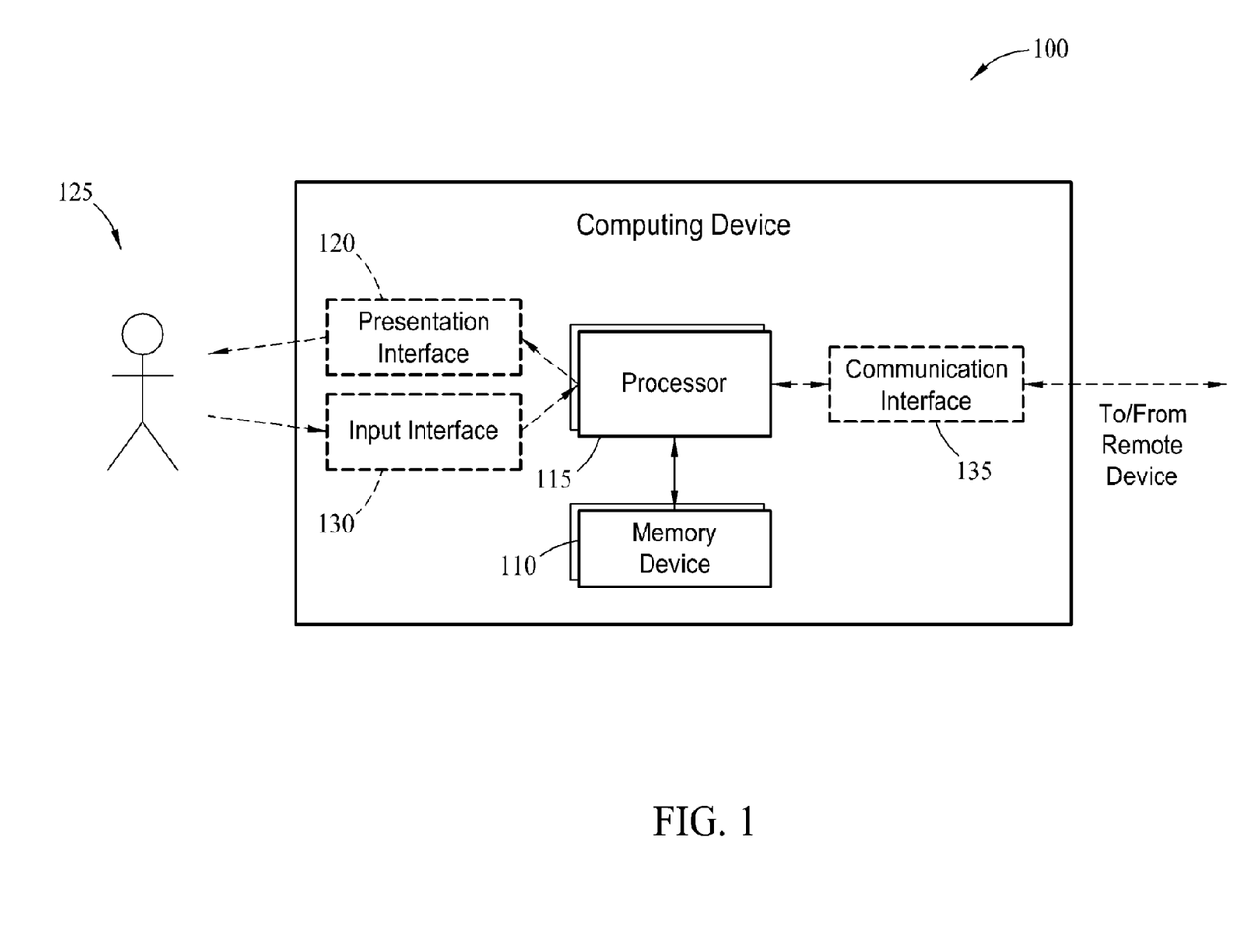
FIG. 1 is a block diagram of an exemplary computing device.

FIG. 1 is a block diagram of an exemplary computing device 100 that may be used to automatically generate a wiring diagram by deconstructing, reconstructing, and/or plotting a wiring configuration. In the exemplary embodiment, computing device 100 includes a memory device 110 and a processor 115 that is coupled to memory device 110 for executing programmed instructions. Processor 115 may include one or more processing units (e.g., in a multi-core configuration). In one embodiment, executable instructions, wiring configuration data, and wiring diagram data are stored in memory device 110. Computing device 100 is programmable to perform one or more operations described herein by programming memory device 110 and/or processor 115. For example, processor 115 may be programmed by encoding an operation as one or more executable instructions and providing the executable instructions in memory device 110.

Processor 115 may include, but is not limited to, a general purpose central processing unit (CPU), a graphics processing unit (GPU), a microcontroller, a reduced instruction set computer (RISC) processor, an application specific integrated circuit (ASIC), a programmable logic circuit (PLC), and/or any other circuit or processor capable of executing the functions described herein. The methods described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term processor.

Memory device 110, as described herein, is one or more devices that enable information such as executable instructions and/or other data to be stored and retrieved. Memory device 110 may include one or more computer readable media, such as, without limitation, dynamic random access memory (DRAM), static random access memory (SRAM), a solid state disk, and/or a hard disk. Memory device 110 may be configured to store, without limitation, executable instructions, wiring configuration data, wiring diagram data, and/or any other type of data suitable for use with the methods and systems described herein.

In the exemplary embodiment, computing device 100 includes a presentation interface 120 that is coupled to processor 115. Presentation interface 120 outputs (e.g., display, print, and/or otherwise output) information, such as, but not limited to, configuration data, wiring configuration data, wiring diagram data, and/or any other type of data to a user 125. For example, presentation interface 120 may include a display adapter (not shown in FIG. 1) that is coupled to a display device, such as a cathode ray tube (CRT), a liquid crystal display (LCD), a light-emitting diode (LED) display, an organic LED (OLED) display, and/or an "electronic ink" display. In some embodiments, presentation interface 120 includes more than one display device. In addition, or in the alternative, presentation interface 120 may include a printer.

In the exemplary embodiment, computing device 100 includes an input interface 130 that receives input from user 125. For example, input interface 130 may be configured to receive an indication of wiring configuration data, wiring diagram data, and/or any other type of data suitable for use with the methods and systems described herein. As described in further detail below, computing device 100 uses the received input to generate a wiring diagram. In the exemplary embodiment, input interface 130 is coupled to processor 115 and may include, for example, a keyboard, a pointing device, a mouse, a stylus, a touch sensitive panel (e.g., a touch pad or a touch screen), a gyroscope, an accelerometer, a position detector, and/or an audio input interface. A single component, such as a touch screen, may function as both a display device of presentation interface 120 and as input interface 130.

In the exemplary embodiment, computing device 100 includes a communication interface 135 coupled to memory device 110 and/or processor 115. Communication interface 135 is coupled in communication with a remote device, such as another computing device 100. For example, communication interface 135 may include, without limitation, a wired network adapter, a wireless network adapter, and/or a mobile telecommunications adapter.

Figure 2:
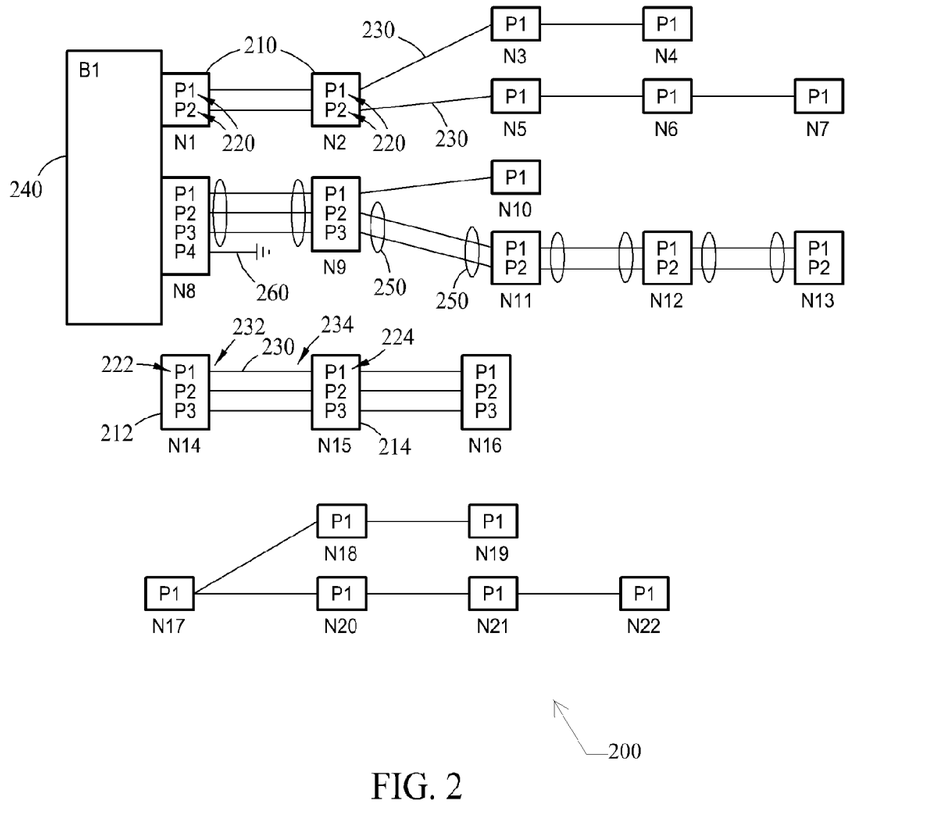
FIG. 2 is an exemplary wiring configuration that may be split using the computing device shown in FIG. 1.

FIG. 2 is an exemplary wiring configuration 200 that may be selectively deconstructed and/or selectively reconstructed using computing device 100 (shown in FIG. 1). As used herein, "deconstructing" and/or "decomposing" wiring configuration 200 includes breaking down and/or separating wiring configuration 200 into constituent parts such that wiring configuration 200 is simplified for further use. As used herein, "constructing" or "reconstructing" wiring configuration 200 includes re-creating wiring configuration 200 using the constituent parts and/or other available information such that a wiring diagram is generated for presentation to user 125. In the exemplary embodiment, wiring configuration 200 includes a plurality of nodes (N) 210 that each includes at least one pin (P) 220. Moreover, in the exemplary embodiment, each node 210 is an electrical component, such as a connector or a switch, and two nodes 210 are coupled to each other via at least one wire 230. More specifically, in the exemplary embodiment, a first end 232 of wire 230 is coupled to a first node 212 at a first pin 222, and a second end 234 of wire 230 is coupled to a second node 214 at a second pin 224. In some embodiments, two or more nodes 210 may be grouped together within a box 240. Moreover, in some embodiments, at least one shield wire 250 may be coupled to at least one wire 230 to facilitate shielding the at least one wire 230. Furthermore, in some embodiments, at least one ground wire 260 may be coupled to at least one node 210 to suitably ground wiring configuration 200. Notably, wiring configuration 200 may include any combination of the wiring components described herein.

Figure 3:
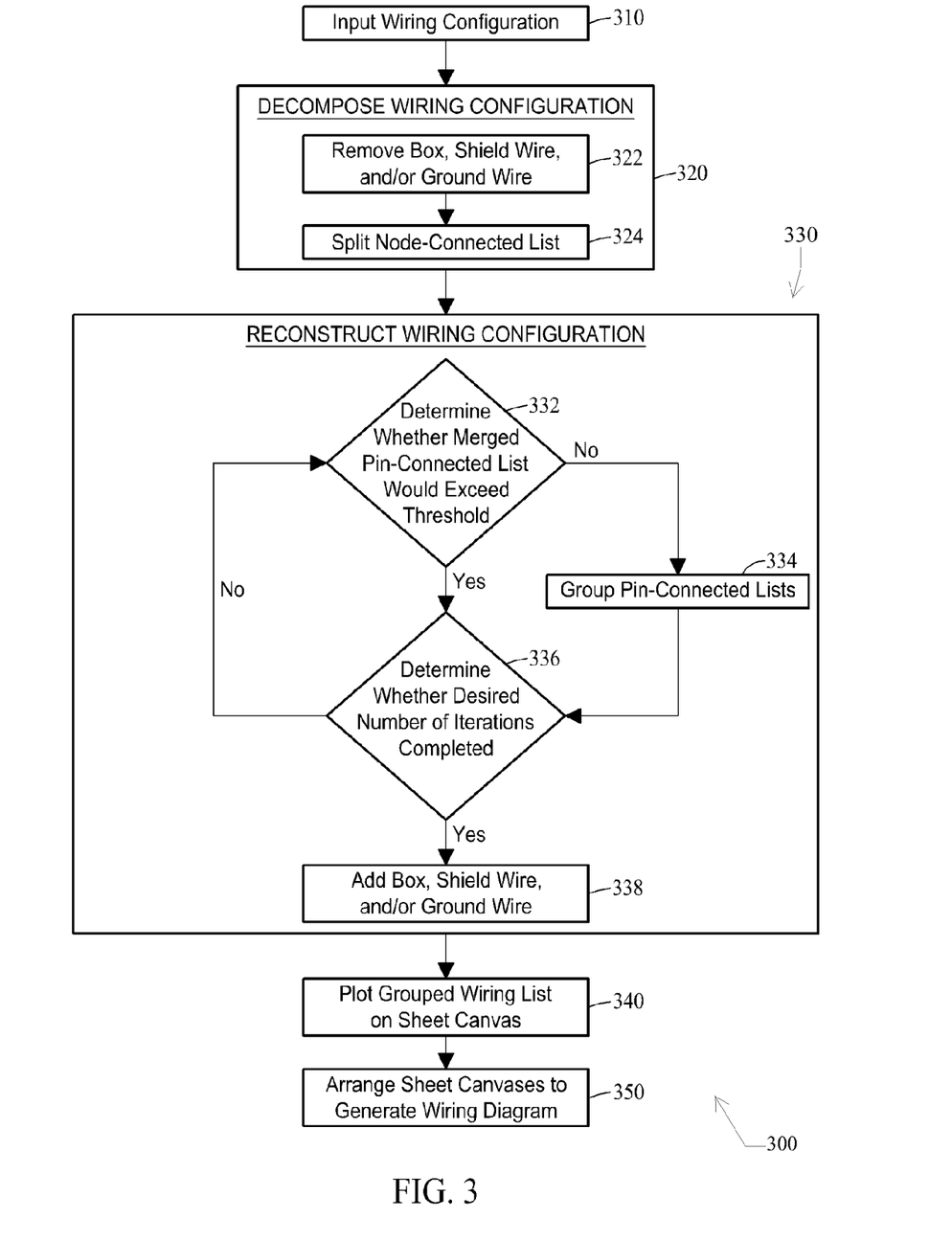
FIG. 3 is a flow chart illustrating an exemplary method for generating a wiring diagram based on the wiring configuration shown in FIG. 2 using the computing device shown in FIG. 1.

FIG. 3 is a flow chart illustrating an exemplary method 300 for use in selectively deconstructing and reconstructing wiring configuration 200 using computing device 100 and using interconnectivity analysis. Initially, data representative of wiring configuration 200 is input 310 into computing device 100. More specifically, in the exemplary embodiment, user 125 inputs 310, via input interface 130, data representative of wiring configuration 200 including data associated with nodes 210, pins 220, wires 230, boxes 240, shield wires 250 and/or ground wires 260.

Figure 4:
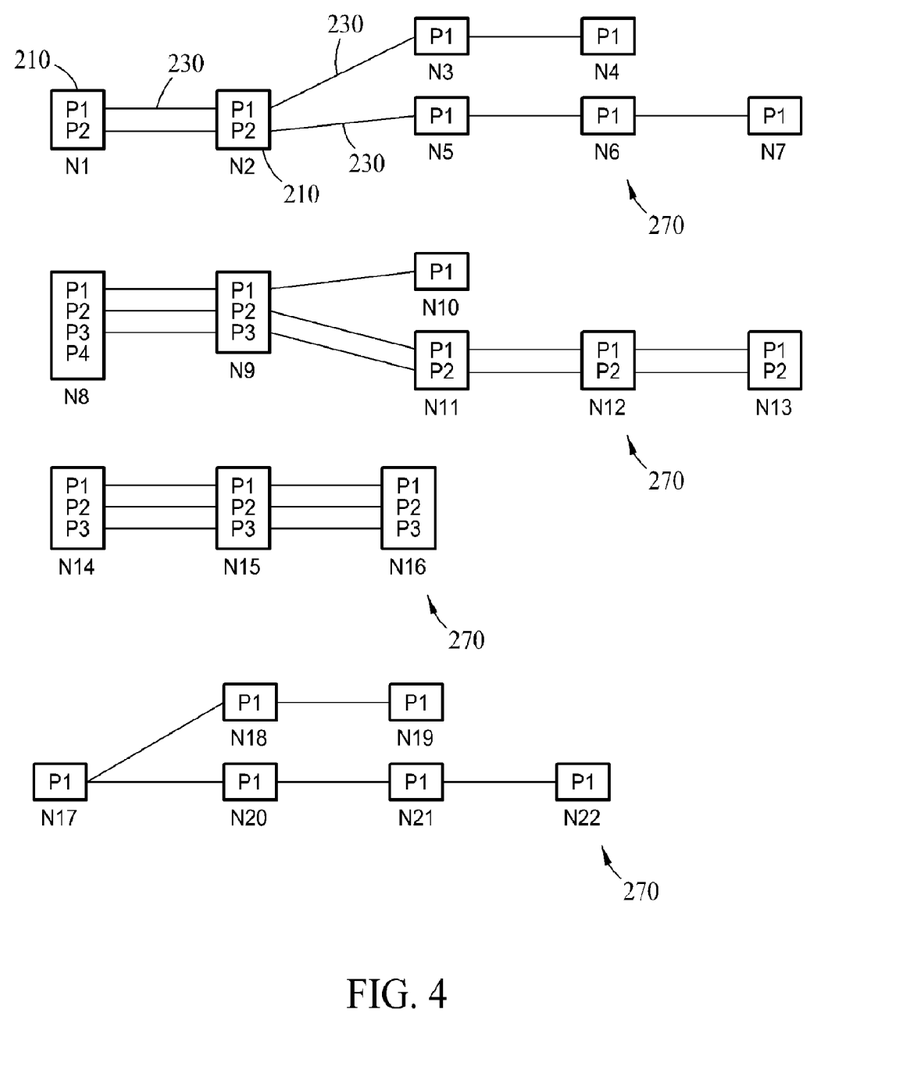
FIGS. 4-10 illustrate exemplary wiring configurations based on the wiring configuration shown in FIG. 2 that may be created at exemplary stages of completion using the method illustrated in FIG. 3.

In the exemplary embodiment, wiring configuration 200 is deconstructed and/or decomposed 320 using an algorithm to facilitate generating a wiring diagram. More specifically, in the exemplary embodiment, wiring configuration 200 is decomposed 320 based on a connectivity of wires 230. For example, in the exemplary embodiment, computing device 100 produces at least one node-connected list 270 (shown in FIG. 4) by removing 322 boxes 240, shield wires 250 and/or ground wires 260 from wiring configuration 200. As such, in the exemplary embodiment, a node-connected list 270 created includes a plurality of wires 230 that share a node 210 with other wires 230 in node-connected list 270. Generally, boxes 240, shield wires 250, and/or ground wires 260 are ignored, at this stage, for purposes of decomposing 320 wiring configuration 200 to generate the wiring diagram. Data associated with a location for each box 240, shield wire 250, and/or ground wire 260 may be stored in memory device 110.

Figure 5:
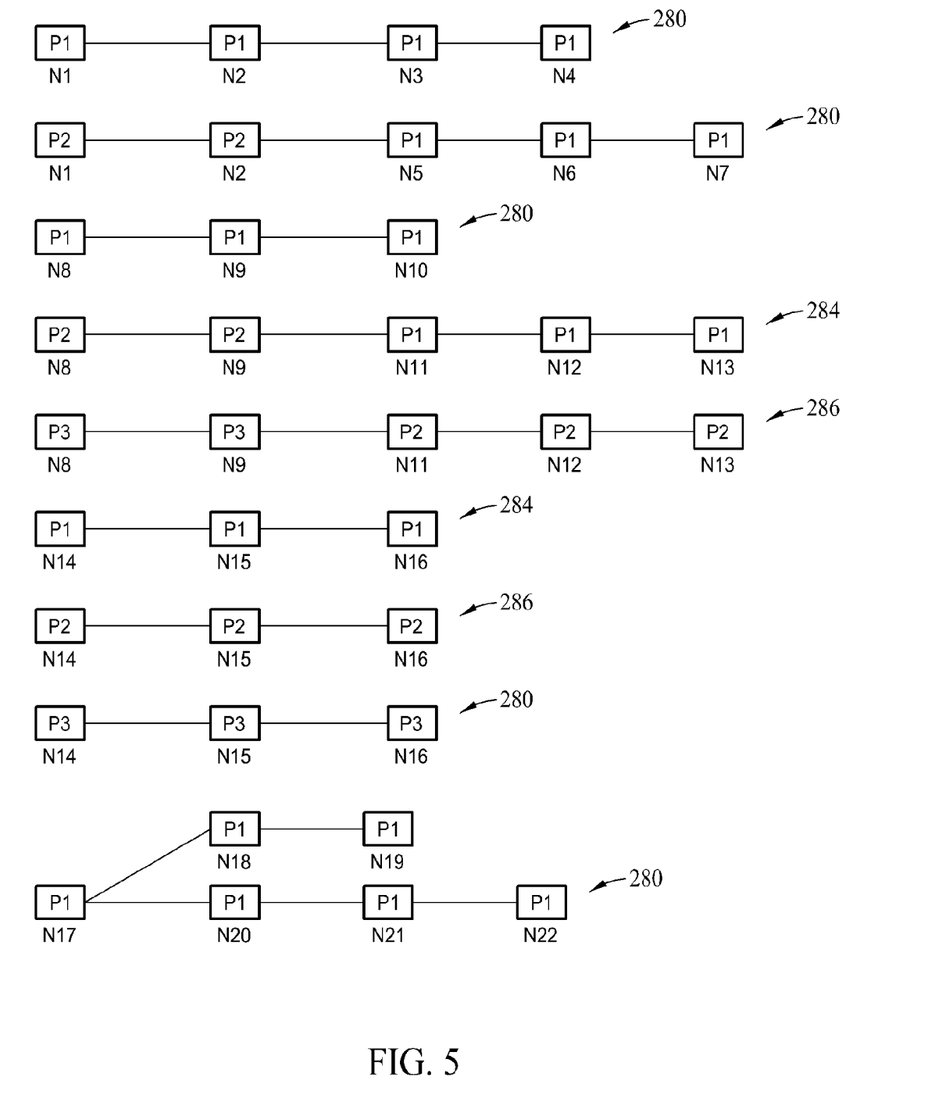

Additionally, in the exemplary embodiment, computing device 100 then splits 324 each node-connected list 270 into at least one pin-connected list 280 (shown in FIG. 5). As such, in the exemplary embodiment, each pin-connected list 280 created includes a plurality of wires 230 that share a pin 220 with other wires 230 in pin-connected list 280. More specifically, in the exemplary embodiment, pin-connected list 280 is a decomposed representation of wiring configuration 200.

In the exemplary embodiment, computing device 100 reconstructs 330 wiring configuration 200 using an algorithm until a desired combination of wires 230 is produced. More specifically, in the exemplary embodiment, computing device 100 constructs a new wiring configuration based on wiring configuration 200. Initially, computing device 100 preliminarily and/or tentatively couples at least two pin-connected lists 280 and determines 332 whether a merged pin-connected list 282 including the at least two pin-connected lists 280 would exceed a predetermined wire count threshold (not shown). If a merged pin-connected list 282 including a first pin-connected list 284 and a second pin-connected list 286 (shown in FIG. 5), based on determination 332, would not exceed the wire count threshold, then merged pin-connected list 282 (shown in FIG. 6) is generated and/or grouped 334 together. Alternatively, if a merged pin-connected list 282 including a first pin-connected list 284 and a second pin-connected list 286, based on determination 332, would exceed the wire count threshold, then merged pin-connected list 282 would not be generated and/or grouped 334 together. In one embodiment, the wire count threshold may be less than twenty wires 230. More specifically, in such an embodiment, the wire count threshold may be less than ten wires 230. Alternatively, the wire count threshold may be variably set at any other threshold level that enables computing device 100 to function as described herein.

In the exemplary embodiment, pin-connected lists 280 are grouped 334 together based on a connectivity of wires 230. More specifically, in the exemplary embodiment, pin-connected lists 280 are grouped 334 together in iterations until the desired combination of wires 230 is produced. For example, pin-connected lists 280 are grouped 334 until a desired number of iterations is completed and/or until the predetermined wire count threshold would be exceeded if any remaining pin-connected lists 280 is grouped 334 together. As such, in the exemplary embodiment, computing device 100 determines 336 whether a desired number of iterations have been completed.

Figure 6:
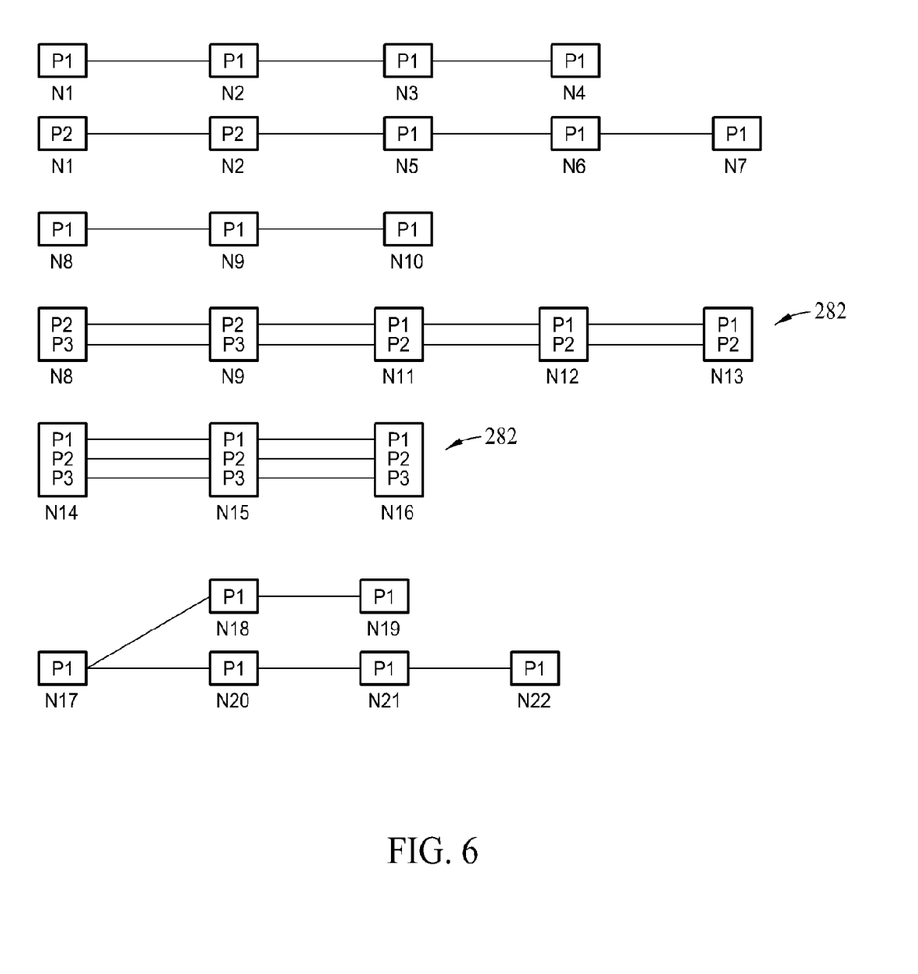
Figure 7:
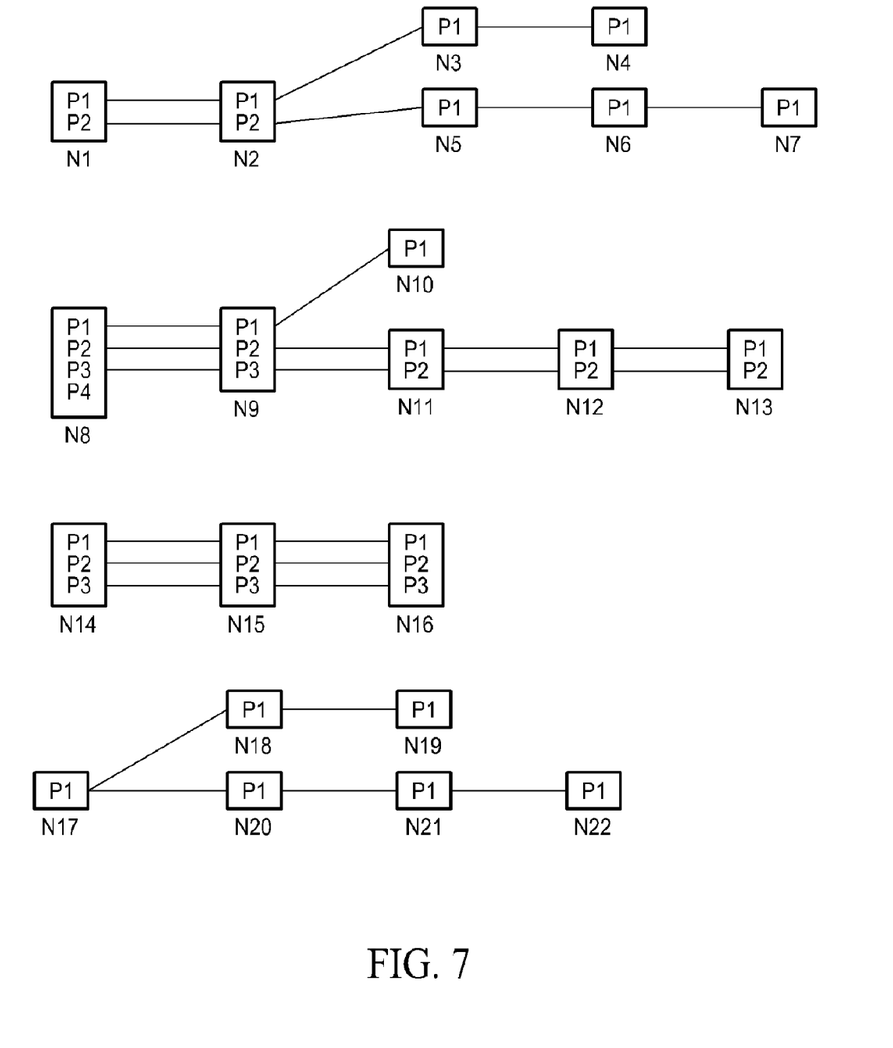

In one embodiment, a first iteration of a portion of the algorithm may include grouping 334 a plurality of pin-connected lists 280 that have 100% of nodes 210 in common (shown in FIG. 6). As such, in such an embodiment, if first pin-connected list 284 and second pin-connected list 286 have 100% of nodes 210 in common, then first pin-connected list 284 and second pin-connected list 286 are coupled to form merged pin-connected list 282. Computing device 100 may perform additional determining 332 and/or grouping 334 steps at any desired threshold level including, but not limited to, pin-connected lists 280 having at least 50% of nodes 210 in common (shown in FIG. 7).

Figure 8:
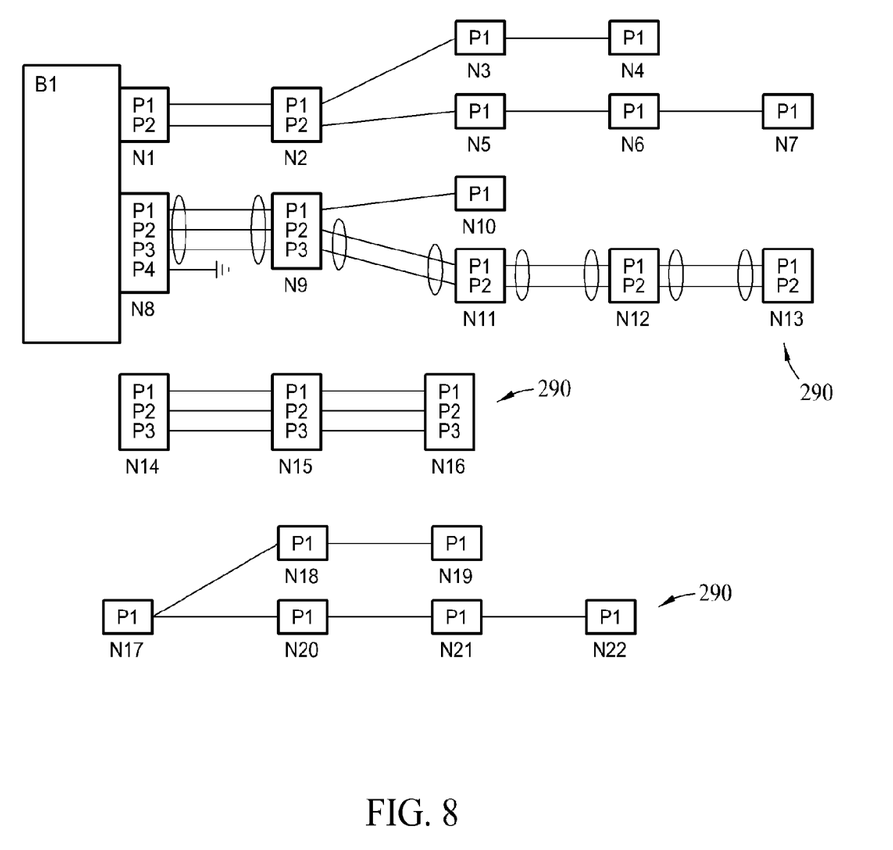

In one embodiment, the threshold levels are pin-connected lists 280 that have 100% of nodes 210 in common, pin-connected lists 280 that have at least 75% of nodes 210 in common, pin-connected lists 280 that have at least 50% of nodes 210 in common, and pin-connected lists 280 that have at least 10% of nodes 210 in common. Alternatively, the threshold level may be any other threshold level that enables computing device 100 to function as described herein. Additionally, in the exemplary embodiment, any previously removed boxes 240, shield wires 250, and/or ground wires 260 may be added 338 to an appropriate pin-connected list 280 and/or merged pin-connected list 282 to produce at least one grouped wiring list 290 (shown in FIG. 8).

Figure 9:
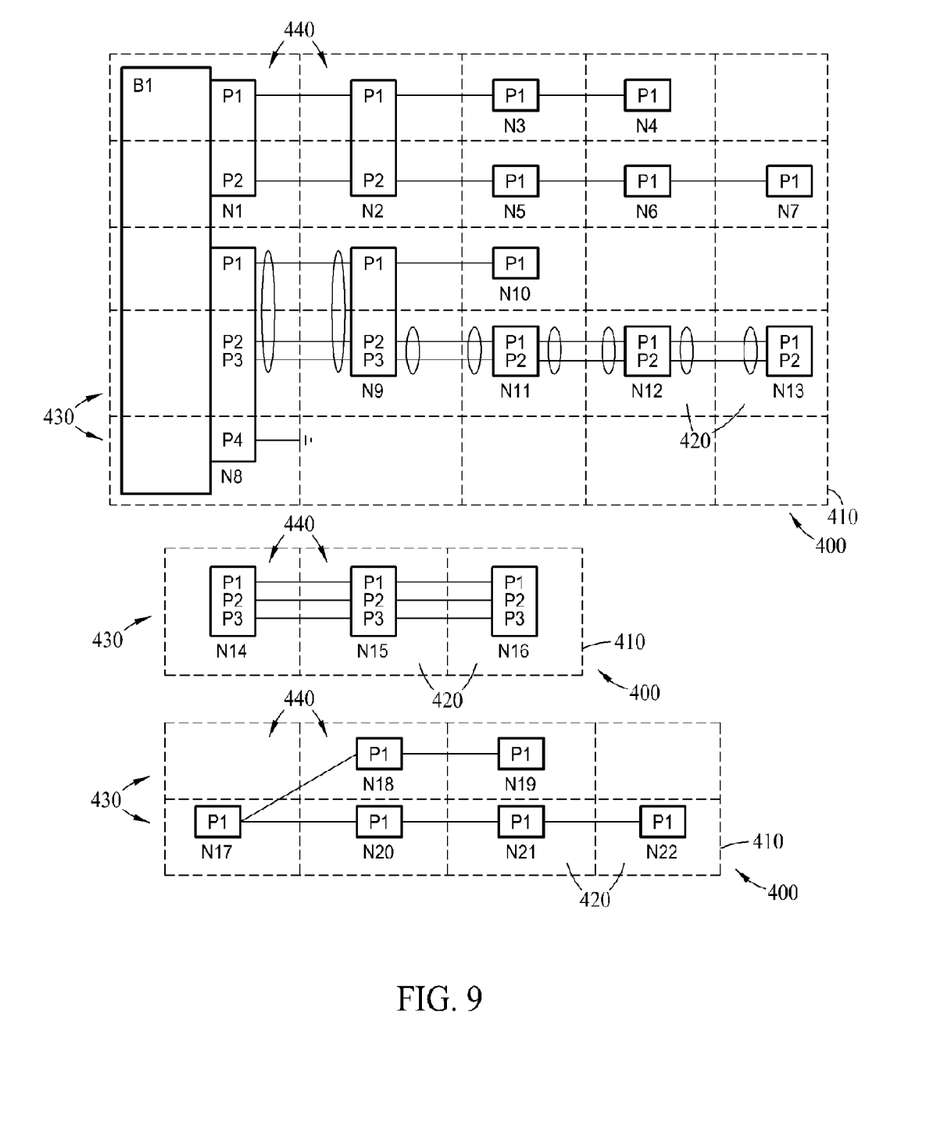

In the exemplary embodiment, each grouped wiring list 290 is plotted 340 on a sheet canvas 400 that includes a grid 410 (shown in FIG. 9). In the exemplary embodiment, at least a portion of grouped wiring list 290 is plotted 340, such that each node 210 is positioned on at least one field 420 of grid 410. As such, the connectivity of each node 210 is presented on each field 420. Each field 420 is defined by an intersecting row 430 and column 440 within grid 410.

Figure 10:
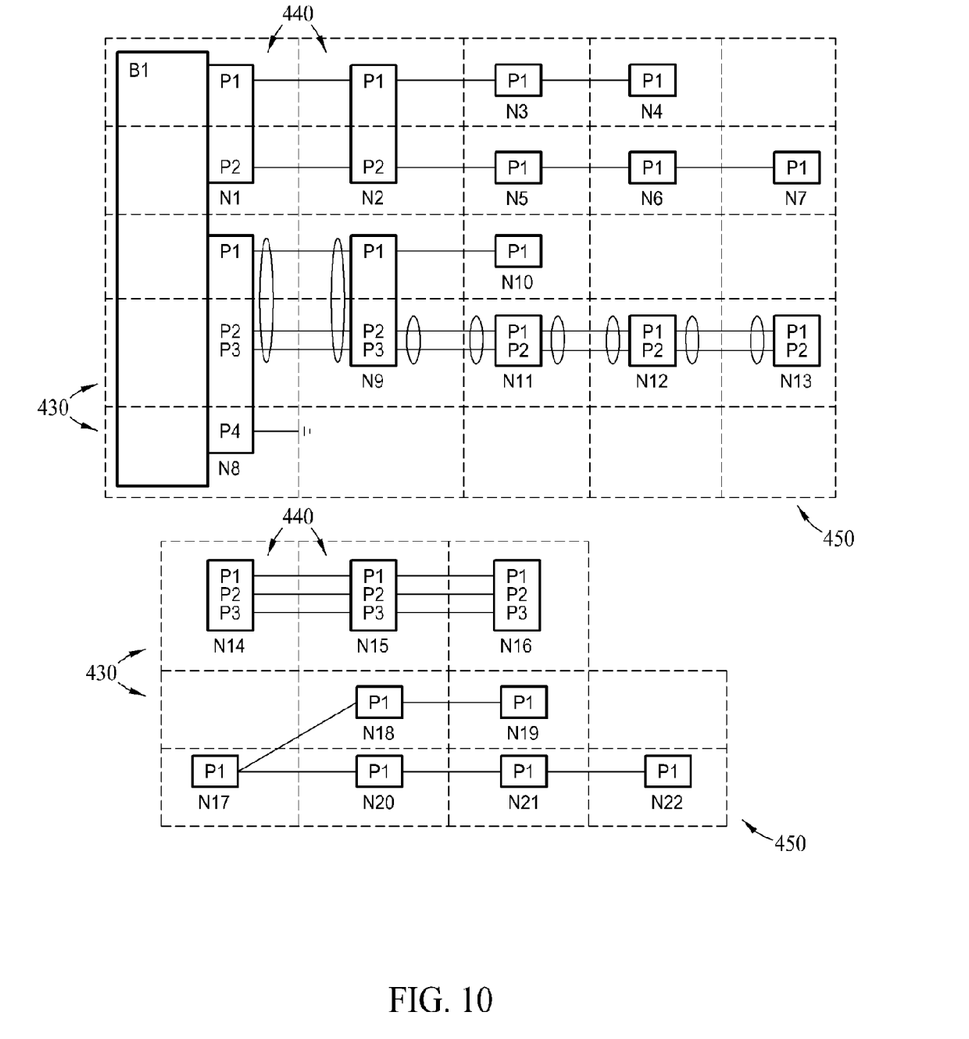

Moreover, as shown in FIG. 10, sheet canvases 400 are arranged 350 to generate at least one drawing sheet or wiring diagram 450 for presentation on, for example, presentation interface 120. In the exemplary embodiment, wiring diagram 450 may be presented based on predetermined display parameters. More specifically, in the exemplary embodiment, wiring diagram 450 is generated to accommodate a predetermined number of rows 430 and columns 440. In one embodiment, wiring diagram 450 is configured to accommodate less than ten rows 430 and ten columns 440. For example, in one embodiment, wiring diagram 450 is configured to accommodate less than five rows 430 and five columns 440. Alternatively, wiring diagram 450 may be configured to accommodate any other number of rows 430 and columns 440 that enables wiring diagram 450 to be used as described herein.

The embodiments described herein enable systematically deconstructing and reconstructing a wiring configuration to present a wiring diagram based on predetermined criteria. The embodiments described herein enable automatically simplifying a wiring diagram for a wiring configuration to reduce time and/or labor involved with splitting the wiring configuration. As such, the embodiments described herein facilitate reducing human intervention and simplifying the process for updating a wiring diagram and/or focusing on a desired portion of a wiring configuration. The exemplary systems and methods are not limited to the specific embodiments described herein, but rather, components of each system and/or steps of each method may be utilized independently and separately from other components and/or method steps described herein. Each component and each method step may also be used in combination with other components and/or method steps.

This written description uses examples to disclose certain embodiments of the invention, including the best mode, and also to enable any person skilled in the art to practice those certain embodiments, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for automatically generating a wiring diagram based on a wiring configuration stored in a memory device, said method comprising:

deconstructing the wiring configuration;

constructing a new wiring configuration on a grid that includes a plurality of fields, the new wiring configuration based on the wiring configuration, wherein at least a portion of the new wiring configuration is arranged based on a predetermined wire count threshold; and generating the wiring diagram based on the plurality of fields.

2. The method in accordance with claim 1, wherein deconstructing the wiring configuration further comprises separating a representation of a plurality of wires based on a connectivity of the plurality of wires.

3. The method in accordance with claim 2, wherein separating a representation of a plurality of wires further comprises removing a representation of at least one of a shield wire and a ground wire from the plurality of wires.

4. The method in accordance with claim 1, wherein constructing a new wiring configuration further comprises grouping a representation of a plurality of wires based on a connectivity of the plurality of wires.

5. The method in accordance with claim 4, wherein grouping a representation of a plurality of wires further comprises adding a representation of at least one of a shield wire and a ground wire from the plurality of wires.

6. A computing device for generating a wiring diagram based on a wiring configuration, said computing device comprising:
   a processor; and
   a memory device coupled to said processor, the wiring configuration stored in said memory device, wherein said computing device is programmed to:
   deconstruct the wiring configuration;
   construct a new wiring configuration on a grid that includes a plurality of fields, the new wiring configuration based on the wiring configuration, wherein at least a portion of the new wiring configuration is arranged based on a predetermined wire count threshold; and
   generate the wiring diagram based on the plurality of fields.

7. The computing device in accordance with claim 6 further comprising a presentation interface coupled to said processor, wherein said computing device is further programmed to present the wiring diagram on at least one drawing sheet.

8. The computing device in accordance with claim 6, wherein said computing device is further programmed to separate a representation of a plurality of wires based on a connectivity of the plurality of wires.

9. The computing device in accordance with claim 6, wherein said computing device is further programmed to remove a representation of at least one of a shield wire and a ground wire from the plurality of wires.

10. The computing device in accordance with claim 6, wherein said computing device is further programmed to group a representation of a plurality of wires based on a connectivity of the plurality of wires.

11. The computing device in accordance with claim 6, wherein said computing device is further programmed to add a representation of at least one of a shield wire and a ground wire from the plurality of wires.

12. A computer-based system for generating a wiring diagram based on a wiring configuration stored in a memory device, said computer-based system comprising:
   a construction module that is programmed to deconstruct the wiring configuration and construct a new wiring configuration on a grid that includes a plurality of fields, the new wiring configuration based on the wiring configuration; and
   a presentation module that is programmed to arrange at least a portion of the new wiring configuration based on a predetermined wire count threshold, and generate the wiring diagram based on the plurality of fields.

13. The computer-based system in accordance with claim 12 further comprising a processor coupled to the memory device, wherein said processor is configured to execute at least one of the construction module and the presentation module.

14. The computer-based system in accordance with claim 13, wherein said construction module is further programmed to remove a representation of at least one of a shield wire and a ground wire from the plurality of wires.

15. The computer-based system in accordance with claim 14, wherein said construction module is further programmed to add a representation of at least one of a shield wire and a ground wire from the plurality of wires.

16. The computer-based system in accordance with claim 12, wherein said construction module is further programmed to separate a representation of a plurality of wires based on a connectivity of the plurality of wires.

17. The computer-based system in accordance with claim 12, wherein said construction module is further programmed to group a representation of a plurality of wires based on a connectivity of the plurality of wires.

* * * * *